(12) United States Patent
Stegmüller

(10) Patent No.: US 6,853,761 B2
(45) Date of Patent: Feb. 8, 2005

(54) OPTOELECTRONIC MODULE

(75) Inventor: Bernhard Stegmüller, Augsburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/339,242

(22) Filed: Jan. 9, 2003

(65) Prior Publication Data

US 2003/0136972 A1 Jul. 24, 2003

(30) Foreign Application Priority Data

Jan. 9, 2002 (DE) .......................................... 102 01 104
Jan. 24, 2002 (DE) .......................................... 102 03 696

(51) Int. Cl.[7] ............................................... G02B 6/12
(52) U.S. Cl. ....................................................... 385/14
(58) Field of Search ................................ 385/8–16, 147; 359/245, 237, 238, 239; 257/461, 458, 17, 22, 627, 628, 355, 336, 344, 356, 546, 463, 656

(56) References Cited

U.S. PATENT DOCUMENTS

| | | | | |
|---|---|---|---|---|
| 5,307,186 A | * | 4/1994 | Izumi et al. | 349/24 |
| 5,663,572 A | * | 9/1997 | Sakata et al. | 257/25 |
| 5,714,765 A | * | 2/1998 | Noetzel et al. | 257/17 |
| 6,222,235 B1 | * | 4/2001 | Kojima et al. | 257/355 |
| 6,359,720 B1 | * | 3/2002 | Yamada | 359/245 |
| 6,492,704 B1 | * | 12/2002 | Coroy | 257/461 |

FOREIGN PATENT DOCUMENTS

| | | |
|---|---|---|
| DE | 39 16 964 A1 | 11/1990 |
| DE | 196 52 529 A1 | 6/1998 |

OTHER PUBLICATIONS

Ramdane, A. et al.: "Monolithic Integration of Multiple–Quantum–Well Lasers and Modulators for High–Speed Transmission", IEEE Journal of Selected Topics in Quantum Electronics, vol. 2, No. 2, Jun. 1996, pp. 326–335.
Yamada, K. et al.: "Electroabsorption Modular with PINIP Structure", Electronics Letters, vol. 34, No. 3, Feb. 5, 1998, pp. 304–307.

* cited by examiner

*Primary Examiner*—Akm Enayet Ullah
(74) *Attorney, Agent, or Firm*—Laurence A. Greenberg; Werner H. Stemer; Gregory L. Mayback

(57) ABSTRACT

An optoelectronic module has at least two components, which are coupled via an optical waveguide, in a monolithically integrated structure. At least two of the components of the module are coupled in series to form an associated PINIP structure, with at least one active layer of the waveguide having a multiquantum well structure, in particular in at least two quantum well types. The optoelectronic module can be driven quite efficiently.

11 Claims, 4 Drawing Sheets

OPTOELECTRONIC MODULE

BACKGROUND OF THE INVENTION

Field of the Invention

The invention relates to an optoelectronic module with two or more components in a monolothically integrated structure. The components are coupled via an optical waveguide.

In order to transmit data electronically at data rates of several Gbit/s by means of optoelectronic modules, it is necessary to control the light intensity efficiently. The modules which are used for this purpose generally have electrooptical modulators which need not be silicon-based. In the range above 10 Gbit/s, the voltage changes which are required to control the modulators are more than 0.5 V and cannot be achieved with an extinction ratio of more than 10 dB by way of silicon-based systems.

Efficient driving of the optoelectronic module therefore represents a problem. For one individual component of a module on its own, it is known from Yamada et al. "Electroabsorption modulator with PINIP structure", Electronic Letters, Feb. 5th, 1998, Vol. 34, No. 3 pp. 304–306 for two electro-absorption modulators to be coupled to one another such that the two PIN structures result in a PINIP structure. However, this does not in itself solve the problem of efficiently driving an optoelectronic module having a number of components.

SUMMARY OF THE INVENTION

It is accordingly an object of the invention to provide a optoelectronic component, which overcomes the above-mentioned disadvantages of the heretofore-known devices and methods of this general type and which provide for an optoelectronic module that can be driven efficiently.

With the foregoing and other objects in view there is provided, in accordance with the invention, an optoelectronic module, comprising a monolothically integrated structure having at least two components coupled in series via an optical waveguide to form an associated PINIP structure, said waveguide having at least one active layer formed with a multiquantum well structure. The multiquantum well structure is preferably formed with at least two quantum well types.

By coupling at least two components of the optoelectronic module in series to form an associated PINIP structure, it is possible to drive the components and the entire module itself efficiently. In particular, it is possible to use a sufficiently high applied voltage change for a number of components of the module. In order to produce the module easily, at least one active layer of the waveguide has a multiquantum well structure, in particular with at least two different quantum well types. This makes it possible, in particular, to make use of the electrooptical characteristics of the different quantum well types, which is not possible in embodiments with only one quantum well type.

It is advantageous for one of the components of the optoelectronic module to be a laser diode, an optoelectronic modulator, in particular an electroabsorption modulator, or an optical amplifier. These components can be connected in series to form PINIP structures in the module.

A control device (electrical driver) can advantageously be used in the differential mode for at least one of the components and/or for the module since this means that a greater voltage change (approximately twice as great) is available than in the single-ended mode. This is true when the drive voltage in the single-ended mode is greater than the diode voltage when the optical amplifier is in the switched-on mode. In comparison to the single-ended mode of a control device, the greater voltage change of the control device in the differential mode is suitable, for example, for operating an electrooptical modulator which is connected in series with an optical amplifier.

At least one connecting line between the control unit and the module advantageously has a traveling wave contact.

It is likewise advantageous for a p contact of one component, in particular of an electro-absorption modulator or of an optical amplifier, to be part of at least one connecting line between the control device and the module.

In a further advantageous refinement of the module according to the invention, a semi-insulating layer, in particular composed of Fe:InP, is arranged between a ground connection and a PINIP structure of the module.

Wells are advantageously arranged between at least two components, such that the components have a high level of optical and electrical decoupling. For a high level of electrical decoupling, at least one well advantageously has ion implantation. This allows the differential mode of the control device to be used.

In accordance with an advantageous feature of the invention, at least one active layer has a quantum dot structure.

Other features which are considered as characteristic for the invention are set forth in the appended claims.

Although the invention is illustrated and described herein as embodied in an optoelectronic module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
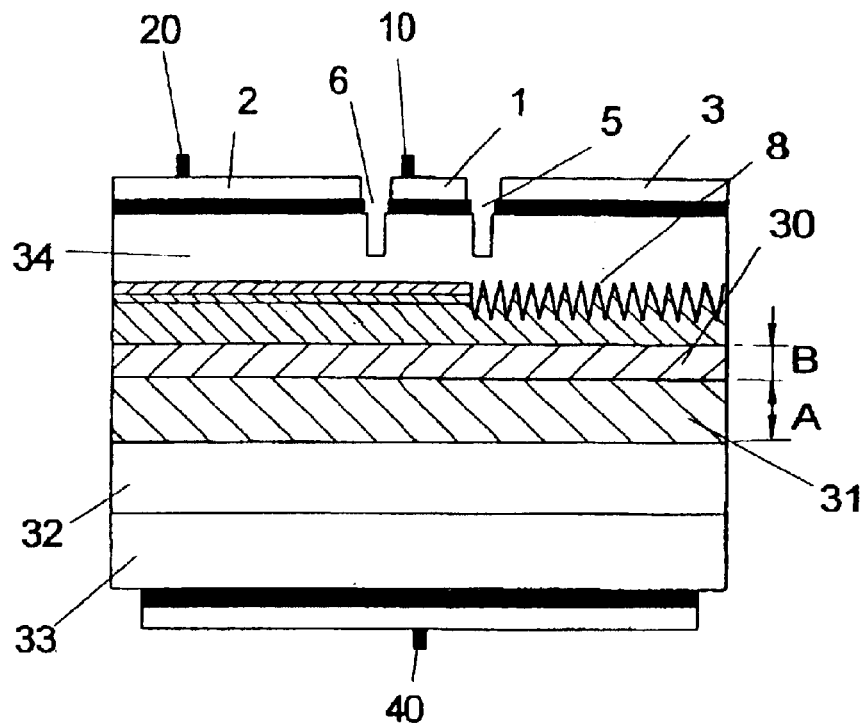
FIG. 1 is a schematic sectional view of a first embodiment of the optoelectronic module according to the invention.

Referring now to the figures of the drawing in detail and first, particularly, to FIG. 1 thereof, there is shown a section taken through a first embodiment of an optoelectronic module according to the invention. Seen from right to left, the components of the first embodiment are a laser diode 3, an electro-absorption modulator 1 (EAM), and an optical amplifier (semiconductor amplifier SOA) 2. All three components 1, 2, 3 are monolithically integrated with a semiconductor material.

The horizontal sequence of the components 1, 2, 3 will be described first of all in the following text, followed by the vertical layer sequence.

The area of the laser diode 3 is shown on the right in FIG. 1. In this case, the laser diode 3 is in the form of a DFB laser (DFB, distributed feedback) with a Bragg grating 8, in a manner which is known per se. The Bragg grating 8 is in this case arranged only in the area of the laser diode 3. The Bragg grating 8 need not in this case extend over the entire length of the laser diode 3. In one alternative embodiment, a DBR laser structure may also be used (DBR, distributed Bragg reflector).

The laser diode 3 is followed, to the left, by the electro-absorption modulator 1. A first well 5 is incorporated in the semiconductor material between the area of the laser diode 3 and the electro-absorption modulator 1. The electro-absorption modulator 1 makes it possible to influence the band structure of the semiconductor by varying the electrical field, so that it is possible to control the intensity of the laser light transmitted through the electro-absorption modulator 1. This type of modulation allows very high-frequency data transmissions. In principle, other configurations of electrooptical modulators are also possible.

The electro-absorption modulator 1 is followed, to the left, by an area for an optical amplifier 2 of a type which is known per se. A second well 6 is formed between the electro-absorption modulator 1 and the optical amplifier 2.

In the vertical extent of the module, a semi-insulating layer 33 (for example composed of Fe:InP) is arranged at the bottom as a substrate. A ground connection 40 is provided underneath the electrooptical module.

A multiquantum well structure (MQW) is grown as the modulator layer 31 on the n-doped layers 32, and is intended for the electro-absorption modulator 1. The thickness A of the modulator layer 30 is between about 0 and 500 nm. MQW structures use the quantum confined stark effect in III–V semiconductor systems (for example InGaAlAs/GaAs or InGaAsP/InP).

An MQW structure is also arranged above this as the active layer 30 for the laser diode 1. The active layer 30 has a thickness B of 0 to 500 nm.

A ratio of the layer thicknesses, expressed as B/(A+B), is greater than 0 and is not greater than 1.

p-doped layers 34 are arranged above the active layer 30.

In the illustrated embodiment, the layers, in particular the modulator layer 30 and the active layer 31, have the same thickness over the entire length of the module, since a structure such as this can be produced easily. The active layer is also a common layer for all the components 1, 2, 3.

In principle, it is also possible for the layer thicknesses not to be constant over the length of the module.

Quantum dot structures may also be used for the active layer. For more information concerning quantum dot structures, see my copending, concurrently filed application Ser. Nos. 10/339,243, 10/339,244, and 10/339,232, the disclosures of which are herewith incorporated by reference.

A negative contact 10 is arranged on the electro-absorption modulator and a positive contact 20 is arranged on the optical amplifier 2 in order to connect the components 1, 2, 3 in series, in this case with the optical amplifier 2 being connected in series with the electro-absorption modulator 1.

The series-connected components 1, 2, which are arranged alongside one another and each intrinsically have a PIN structure make it possible to provide an electrical PINIP structure in the present embodiment of the module. The optical amplifier 2 is thus operated in the forward direction, and the electro-absorption modulator 1 is operated in the reverse direction.

A structure such as this makes it possible to operate the electro-absorption modulator 1 with a differential mode of a control unit (driver) which is not illustrated here. In this case, the optical amplifier 2 is in this case sufficiently highly positively biased that sufficient current is available for optical amplification, with the voltage change of the control device being sufficient to likewise operate the electro-absorption modulator 1. The differential mode is particularly suitable in conjunction with MQW structures which have more than one quantum well type, since optical amplification can be achieved in addition to the electronic drive for the electro-absorption modulator 1.

The wells 5, 6 in the first embodiment of the module according to the invention allow a high level of optical decoupling and a high level of electrical decoupling between the components 1, 2, 3. The electrical contacts are in this case isolated in the area of the material of one doping type (in this case advantageously p-doping).

Figure 1A:
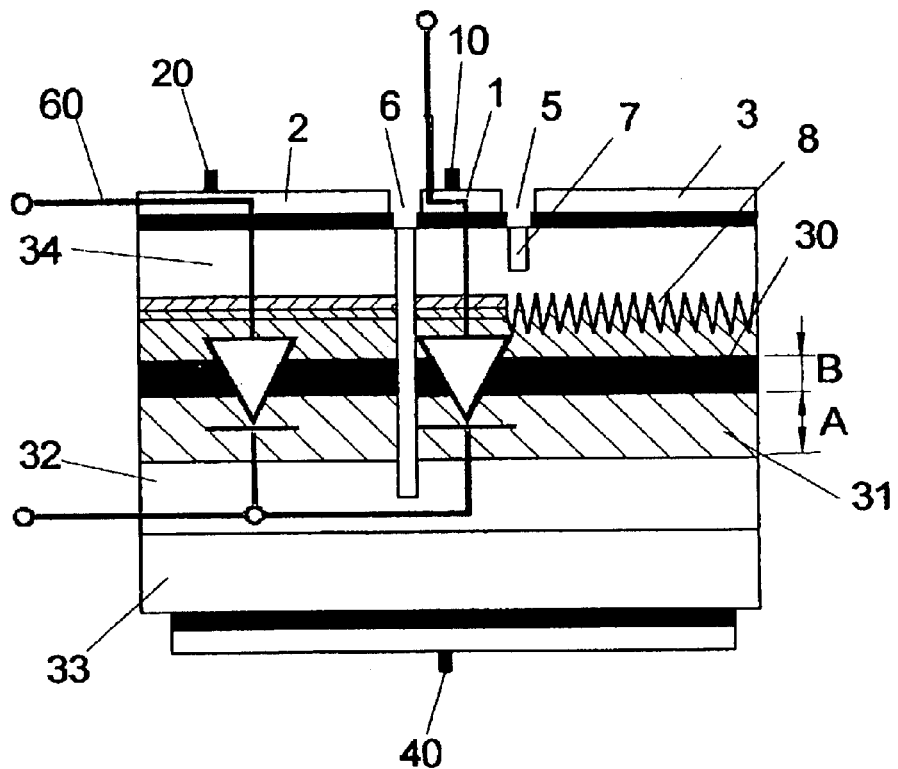
FIG. 1A is a schematic sectional view of one variant of the first exemplary embodiment.

FIG. 1A describes one variant of the first embodiment in which the second well 6 is drawn deeply into the n-doped layer 32. In consequence, the electro-absorption modulator and the optical amplifier are separated from one another in the optical waveguide. A triode circuit 60 is illustrated schematically, in order to show the principle of operation.

An optical amplifier 2 and an electro-absorption modulator 1 connected in series have been described in the present exemplary embodiment. In principle, it is also possible to connect other combinations of the components in series.

Figure 2:
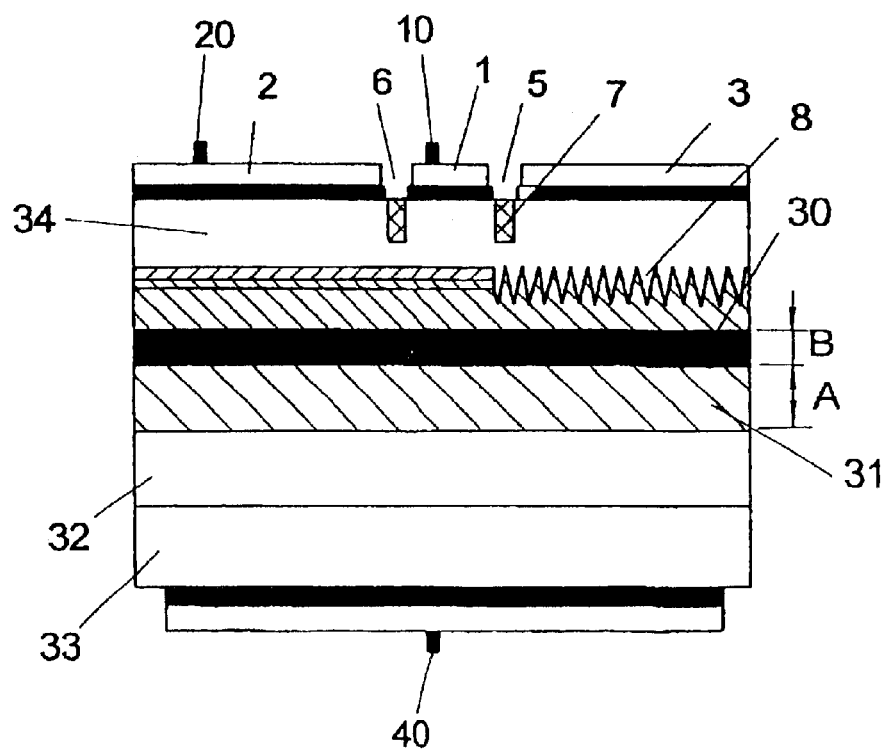
FIG. 2 is a schematic sectional view of a second embodiment of the optoelectronic module according to the invention.

Fundamentally, the same structure of an electrooptical module is described in FIG. 2, so that reference is made to the above statements.

The second embodiment, which is illustrated in FIG. 2, is similar to the first embodiment since wells 5, 6 are also arranged between the components 1, 2, 3 here. However, in this case, the electrical isolation is achieved by means of ion implantation 7, which results in a low level of optical decoupling but a high level of electrical decoupling. As stated in the description relating to FIG. 1, the contacts are isolated on a material with the same doping.

Figure 2A:
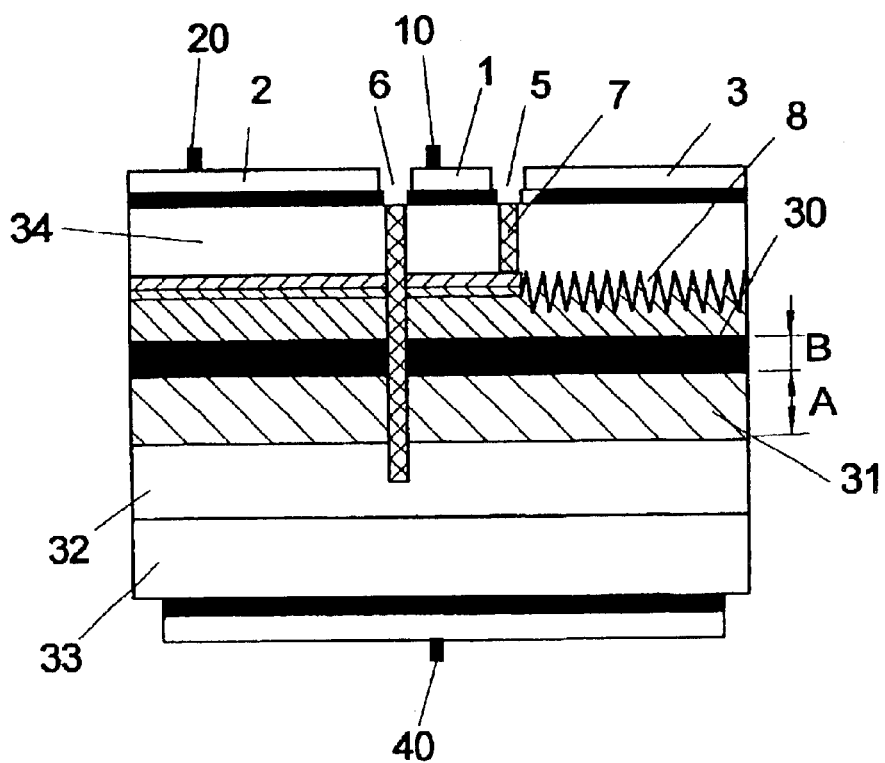
FIG. 2A is a schematic sectional view of one variant of the second exemplary embodiment.

FIG. 2A shows one variant of the second embodiment in which the wells 5, 6 are provided with ion implantation. The second well is in this case drawn into the n-doped layer in an analogous manner to the variant shown in FIG. 1a. The description relating to FIG. 1a is applicable in an analogous manner.

Figure 3:
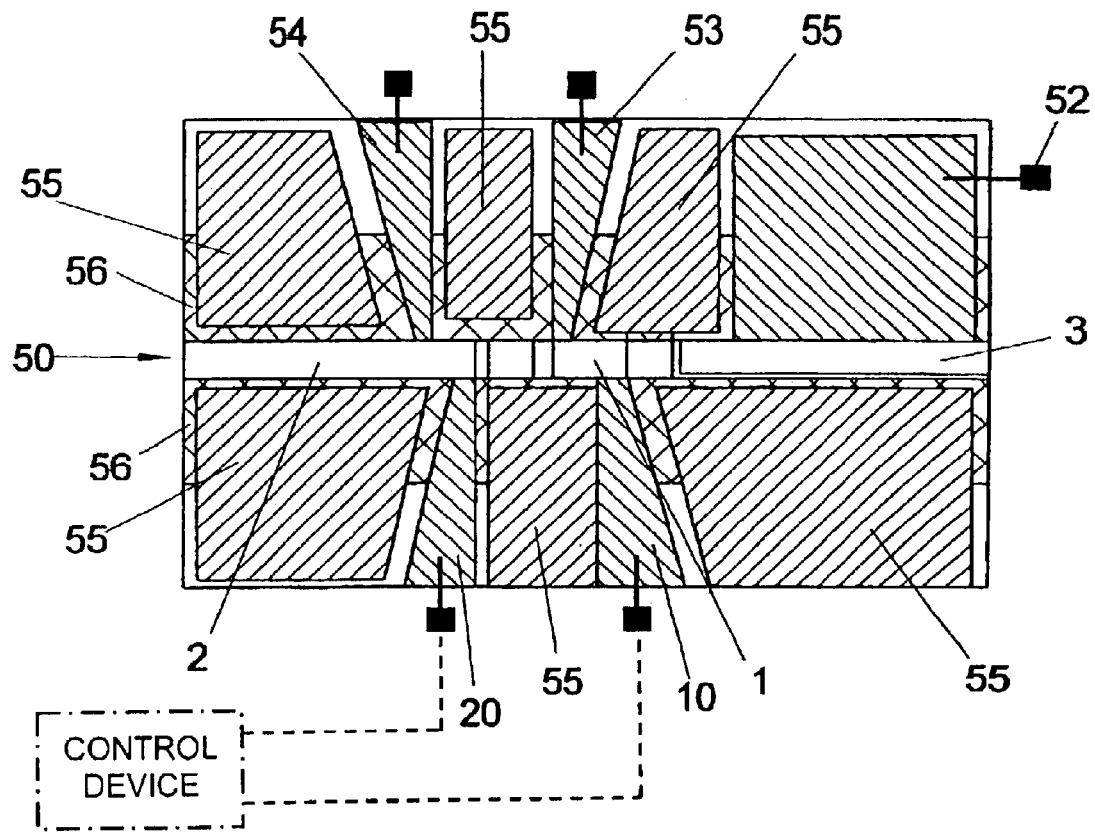
FIG. 3 is a schematic plan view onto an exemplary embodiment of the optoelectronic module according to the invention.

FIG. 3 essentially illustrates a plan view of the first embodiment of the optoelectronic module according to the invention. The laser diode 3, the electro-absorption modulator 1, and the optical amplifier 2 are arranged from right to left along the waveguide 50.

The positive contact 20 is part of a connecting line between the optical amplifier 2 and the control device, which is diagrammatically illustrated only in phantom. The negative contact 10 is part of a connecting line between the electro-absorption modulator 1 and the control device. The control device operates in the differential mode.

As described above, the two components 1, 2 are connected in series. In contrast with the first embodiment, the connecting line to the control device has traveling wave contacts 10, 20.

The electro-absorption modulator 1 is connected to the RF terminating impedance (which is not illustrated here) via a connection 53, and the optical amplifier 2 is connected to the RF terminating impedance (which is not illustrated here) via a further connection 54.

Furthermore, a positive contact 52 is provided for the laser diode 3. A number of ground contacts 55 are also provided on it.

All said contacts and connections are arranged on the top face of the optoelectronic module.

Figure 4A:
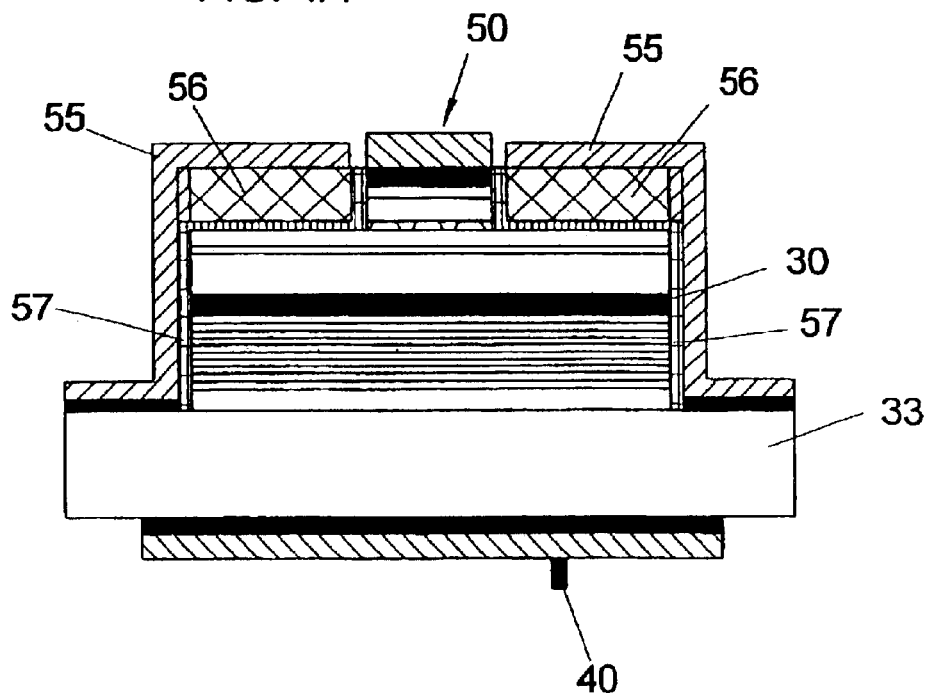
FIGS. 4A–4C are three schematic sectional views relating to different variants of the lateral arrangements of layers in the optoelectronic module according to the invention.

FIG. 4A shows a section view transversely with respect to the waveguide 50, with the section view passing through the optical amplifier 2 in the view shown in FIG. 4A. A dielectric coating 56, for example composed of BCB (bis-benzocyclobutene) is arranged at the side alongside the waveguide 50 and underneath the ground contacts 55. An electrical isolation layer 57 (dielectric, for example SiN, $SiO_x$, $Al_2O_3$) is arranged underneath the dielectric coating 56 and in each case surrounds the layer stack at the sides. The layer stack is arranged on the semi-insulating layer 33, and the ground connection 40 is arranged underneath it.

Figure 4B:
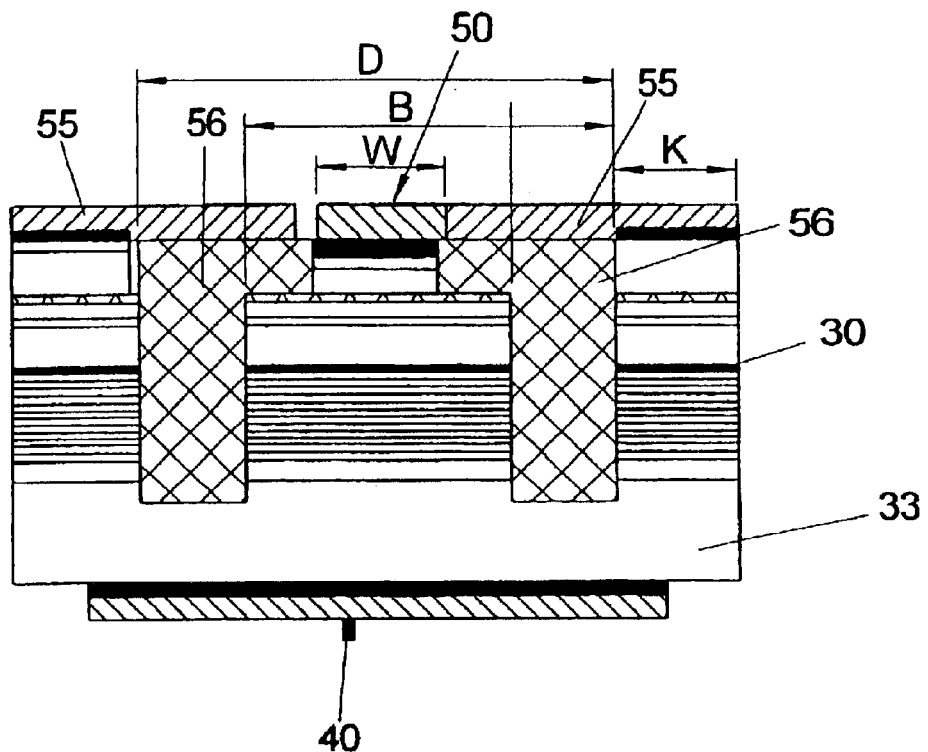

FIG. 4B shows an alternative refinement of the optoelectronic module, in which dielectric coatings 56 are likewise provided at the side of the waveguide 50, analogously to the refinement shown in FIG. 4A. However, these dielectric coatings 56 extend more deeply, specifically as far as the semi-insulating layer 33. The ground contacts are also located at the top on the dielectric coating 56.

A number of the dimensions will be described with reference to this embodiment, and can also be transferred in the same sense to the other variants.

The width W of the waveguide 50 is less than 2 μm, the width B of the central layer stack of the module is equal to or greater than the width W but is less than 20 μm. The width D with the dielectric coatings is greater than the width B, but is less than 200 μm. The layer structure arranged at the side has a width K of less than 80 μm.

Figure 4C:
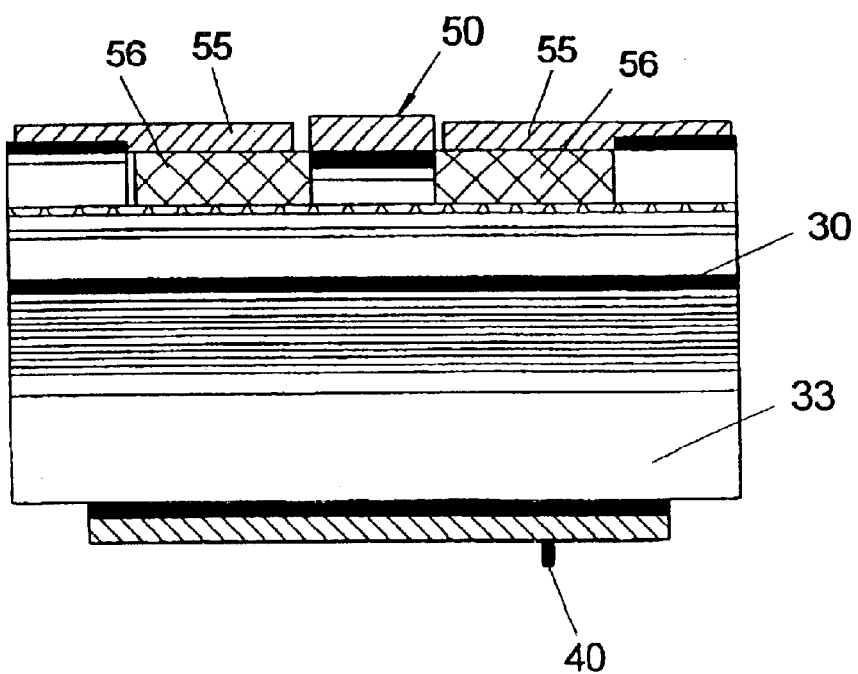

The variant shown in FIG. 4C is constructed analogously to the variant shown in FIG. 4B, but with the dielectric layers 56 not extending as far as the semi-insulating layer 33.

The embodiment of the invention is not restricted to the preferred exemplary embodiments described above. It will be understood by those skilled in the pertinent art that a number of variants are feasible which also make use of the optoelectronic module according to the invention in fundamentally different types of embodiments.

I claim:

1. An optoelectronic assembly, comprising:

an optoelectronic module with a monolothically integrated structure having at least two components coupled in series via an optical waveguide to form an associated PINIP structure, said waveguide having at least one active layer formed with a quantum well structure, said quantum well structure having at least two quantum well types; and a control device for operating at least one of said components of said modules, said control device having a differential mode for operation of said components of said module.

2. The optoelectronic assembly according to claim 1, wherein one of said components is a component selected from the group consisting of a laser diode, an electrooptical modulator, and an optical amplifier.

3. The optoelectronic assembly according to claim 1, wherein one of said components is an electro-absorption modulator.

4. The optoelectronic assembly according to claim 1, which comprises a traveling wave contact forming a connecting line between said optoelectronic module and said control unit.

5. The optoelectronic assembly according to claim 1, wherein a p contact of one of said components forms a part of at least one connecting line between said control device and said module.

6. The optoelectronic assembly according to claim 5, wherein said p contact is a part of an electro-absorption modulator or of an optical amplifier.

7. The optoelectronic assembly according to claim 1, which comprises a semi-insulating layer formed between a ground connection and a PIN structure of the module.

8. The optoelectronic assembly according to claim 7, wherein said semi-insulating layer is composed of Fe:InP.

9. The optoelectronic assembly according to claim 1, wherein said monolothically integrated structure is formed with wells between at least two of said components.

10. The optoelectronic assembly according to claim 9, wherein at least one of said wells contains ion implantation.

11. The optoelectronic assembly according to claim 1, which comprises at least one active layer formed with a quantum dot structure.

* * * * *